United States Patent [19]

Suwa

[11] Patent Number: 4,532,575
[45] Date of Patent: Jul. 30, 1985

[54] ELECTRONIC EQUIPMENT HAVING KEY INPUT FUNCTION

[75] Inventor: Kaname Suwa, Yokohama, Japan

[73] Assignee: Canon Kabushiki Kaisha, Tokyo, Japan

[21] Appl. No.: 452,635

[22] Filed: Dec. 23, 1982

[30] Foreign Application Priority Data

Dec. 29, 1981 [JP] Japan .................. 56-215327

[51] Int. Cl.³ .............................................. H05K 1/14
[52] U.S. Cl. .................................. 361/413; 200/5 A; 200/5 R; 340/365 R; 361/398; 361/412; 361/415
[58] Field of Search ............... 361/412, 415, 398, 413; 200/5 A, 5 R; 340/365 R

[56] References Cited

U.S. PATENT DOCUMENTS

| 3,629,787 | 12/1971 | Wilson | 361/398 X |
| 3,911,234 | 10/1975 | Kotaka | 361/398 X |
| 4,066,851 | 1/1978 | White et al. | 200/5 A |
| 4,145,584 | 3/1979 | Otterlei | 200/5 A |
| 4,180,711 | 12/1979 | Hirata et al. | 361/398 X |
| 4,261,042 | 4/1981 | Ishiwatari et al. | 361/398 X |
| 4,336,529 | 6/1982 | Buan | 361/416 X |
| 4,367,385 | 1/1983 | Frame | 200/5 A X |

Primary Examiner—R. R. Kucia
Attorney, Agent, or Firm—Fitzpatrick, Cella, Harper & Scinto

[57] ABSTRACT

A first printed circuit board with electronic components mounted thereon is connected to a second printed circuit board having a first contact for key input by electrically connecting means. A spacer is interposed between the electrically connecting means and the second printed circuit board to separate them. The electrically connecting means has a second contact which contacts the first contact, and is connected to the first printed circuit board by urging means.

10 Claims, 4 Drawing Figures

ELECTRONIC EQUIPMENT HAVING KEY INPUT FUNCTION

BACKGROUND OF THE INVENTION

1. Field of the Invention

The present invention relates to electronic equipment having a key input function such as an electronic portable calculator (to be referred to as an electronic calculator for brevity hereinafter).

2. Description of the Prior Art

The internal structure of a conventional electronic calculator is shown in FIG. 1. An upper case 1 and a lower case 2 of a housing are both made of a plastic material such as ABS resin. A decorative laminated sheet 3 of an aluminum thin layer is formed on the upper surface of the upper case 1 as needed. A plurality of key tops 4 are arranged at equal intervals at a key input section and are slidably fitted in the holes formed in the upper case 1. A key rubber sheet is disposed at the lower surface of the upper case 1. The key rubber sheet 5 has projections 5a at the positions corresponding to the respective key tops 4. These projections 5a serve to provide upward pressure on the corresponding key tops 4. The key rubber sheet 5 is made of a rubber such as silicone rubber, which has relatively stable properties and satisfactory compressive recovery force. The shape and function of the key rubber sheet 5 will further be described. Each projection 5a urging the lower surface of the corresponding key top 4 upward has an electrically conductive rubber member 5b containing an electrically conductive material such as carbon on its inner, lower surface. The electrically conductive rubber member 5b is obtained by punching an electrically conductive rubber sheet into a predetermined shape. The electrically conductive rubber members 5b are inserted at predetermined positions in a mold before vulcanization and the key rubber sheet 5 is then vulcanized and molded. Thus, the manufacture of the key rubber sheet 5 requires, before fixing of the electrically conductive members 5b, steps of pressing an electrically conductive rubber, insertion of the electrically conductive rubber members 5b in the mold, and so on. This results in a higher manufacturing cost.

An inclined thin skirt 5c surrounds each projection 5a of the key rubber sheet 5. The bottom of the skirt 5c terminates in a base 5b. The skirts 5c formed integrally with each other by the bases 5d and the projections 5a connected to the skirts 5c are arranged immediately below the corresponding key tops 4. Thus, the skirts 5c and the projections 5a number the same as the key tops 4. A hard printed circuit board 6 made of paper phenol, a glass epoxy or the like is fixed to the lower surfaces of the bases 5b. The hard printed circuit board 6 is fixed to the upper case 1 with tapping screws. The base 5d of the key rubber sheet 5 is sandwiched and fixed between the hard printed circuit board 6 and the upper case 1. When the upper surface of a key top 4 is depressed with a finger or the like in the key input section as described above, the projection 5a of the key rubber member 5 is urged and the skirt 5c is gradually deformed under pressure to increase its resistance. However, when the key top 4 is further depressed, the skirt 5c is bent and abruptly looses its resistance to the downward force. Then, a clicking is felt by the finger, and the lower surface of the electrically conductive rubber member 5b contacts the upper surface of the hard printed circuit board 6. A key input contact pattern formed in a predetermined shape is bridge-connected by the conductive rubber member 5b, and a key input signal is supplied to an LSI 7 as an arithmetic/processing section of the electronic calculator. The LSI 7 processes the key input signal and produces a display signal. The display signal is supplied to liquid crystal display elements 9 through a circuit pattern on the hard printed circuit board 6 and urging interconnectors 8. The liquid crystal display elements 9 display characters, symbols and the like. In general, metallic pins 7a of the LSI 7 are soldered to the circuit pattern of the hard printed circuit board 6. Therefore, a relatively expensive printed circuit board which is capable of withstanding soldering heat is used. However, in the case of a printed circuit board which extends up to the key input section where there are no parts to be soldered as in the case of this conventional electronic calculator, the area of the printed circuit board 6 is increased. Thus, only a smaller number of printed circuit boards may be obtained from a printed circuit board sheet of a predetermined area, resulting in higher cost of the electronic calculator.

SUMMARY OF THE INVENTION

It is an object of the present invention to provide electronic equipment which is simple in construction and which has a key input function.

It is another object of the present invention to allow manufacture of electronic equipment at low cost.

It is still another object of the present invention to allow easy assembly of electronic equipment.

It is still another object of the present invention to allow formation of a complex circuit pattern on a printed circuit board.

The above and other objects of the present invention will become apparent from the following description taken in conjunction with the accompanying drawings.

DETAILED DESCRIPTION OF THE PREFERRED EMBODIMENTS

Figure 1:
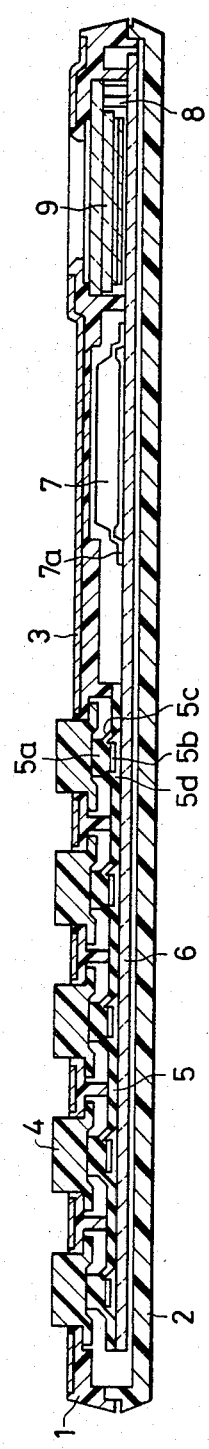
FIG. 1 is a side sectional view showing the internal structure of a conventional electronic calculator.
Figure 2:
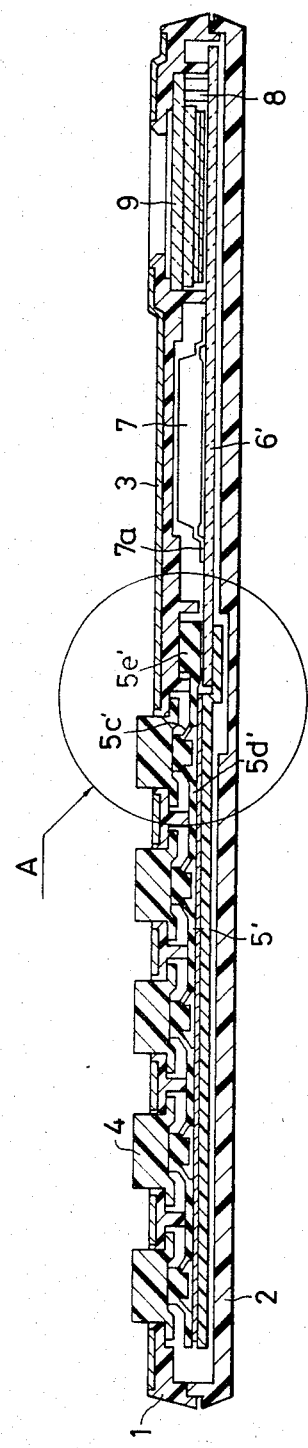
FIG. 2 is a side sectional view showing the internal structure of an electronic calculator according to an embodiment of the present invention.

FIG. 2 is a side sectional view showing the internal structure of the electronic calculator according to the embodiment of the present invention. The same reference numerals in FIG. 2 denote the same parts in FIG. 1.

In referring to FIG. 2, a hard printed circuit board 6' having heat resistance to withstand soldering heat extends to the lower surfaces of the liquid crystal elements 9, to the soldering part of the LSI 7, and to a printed circuit board connecting pattern to be described later. However, the hard printed circuit board 6' does not extend to the key input section. The hard printed circuit board 6' of this embodiment thus has a smaller area than that of the conventional board shown in FIG. 1 and is less costly.

Figure 3:
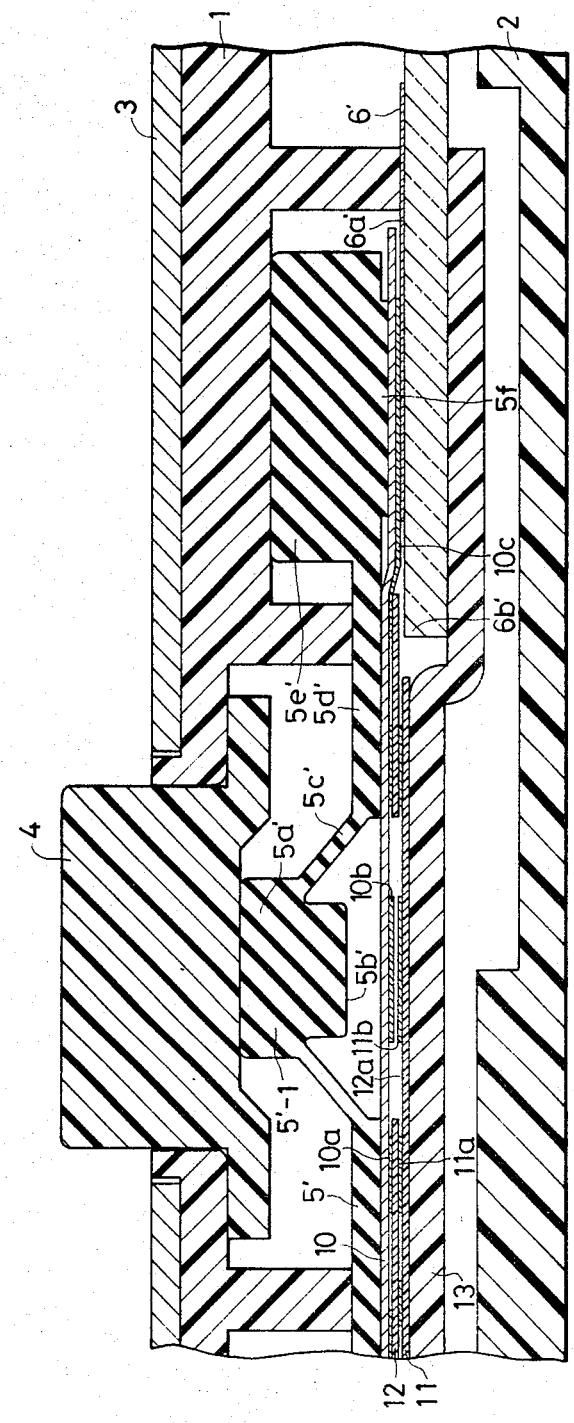
FIG. 3 is an enlarged view of the electronic calculator shown in A port of FIG. 2.

FIG. 3 is an enlarged view showing the structure of the key input section and the printed circuit board connecting pattern. A key rubber sheet 5' of this embodiment differs from the key rubber sheet 5 shown in FIG. 1 in that the electrically conductive rubber is not fixed to an inner, lower surface 5b' of each projection 5a'. The key rubber sheet 5' as a key input operation means is integrally made of an electrically non-conductive material such as natural rubber. Thus, the step of manufacturing the electrically conductive rubber members 5b of the conventional electronic calculator can be eliminated so that mass-production of electronic calculators is facilitated. The projection 5a' is formed in each recess 5'-1 of the key rubber sheet 5. An inclined thin skirt 5c' is formed to surround the projection 5a'. The bottom of the skirt 5c' terminates in a base 5d' as in the case of the key rubber sheet 5. A flexible printed circuit board 10 contacts the lower surfaces of the bases 5d' and a circuit pattern 10a is formed on the lower surface of the flexible printed circuit board 10. Another flexible printed circuit board 11 with a circuit pattern 11a formed on its upper surface is arranged below the flexible printed circuit board 10 with a predetermined distance therebetween. A spacer 12 of a suitable thickness as a spacing means is interposed between the two flexible printed circuit boards 10 and 11 so as to prevent contact between their circuit patterns 10a and 11a. Key input contact patterns 10b and 11b are formed to oppose each other through a gap roughly corresponding to the thickness of the spacer 12 and to be directly below surface 5b' of the projection 5a' of the key rubber sheet 5'. Notches 12a are formed in the spacer 12 at its positions corresponding to the key input contact patterns 10b and 11b. A reinforcing plate 13 such as an iron plate which has a great rigidity and does not cause flexure contacts the lower surface of the flexible printed circuit board 11 and is fixed to the upper case 1 with tapping screws or the like. In this manner, the rubber bases 5b' of the key rubber sheet 5', the flexible printed circuit board 10, the flexible printed circuit board 11, and the spacer 12 are clamped between the upper case 1 and the reinforcing plate 13 to be fixed thereby. The flexible printed circuit board 10 extends over a hard printed circuit board 6' on which electronic components are mounted by conventional soldering or the like. A connecting pattern 10c of the flexible printed circuit board 10 opposes a connecting pattern 6a' of the hard printed circuit board 6' to be in direct contact with each other. Part of the key rubber sheet 5 surrounding the base 5d' extends to the connecting patterns 10c and 6a' for connecting the printed circuit boards 10c and 6' to form a press portion 5e' thicker than the base 5d'. The upper surface of the press portion 5e' is defined by the inner surface of the upper case 1, while its lower surface is defined and compressed by the hard printed circuit board 6' and the reinforcing plate 13. By the urging force of the press portion 5e', the flexible printed circuit board 10 is urged against the hard printed circuit board 6' so that the connecting patterns 10c and 6a' may contact each other stably. A press surface 5f of the press portion 5e' for pressing the flexible printed circuit board 10 projects downward from the lower surface of the base 5d'. The area of contact between the press surface 5f and the flexible printed circuit board 10 is smaller than that between the upper surface of the press portion 5e' and the inner surface of the upper case 1. Therefore, the urging force may effectively act on the connecting patterns 10c and 6c'.

The spacer 12 extends over the hard printed circuit board 6' and extends to a position immediately in front of the contact area between the connecting patterns 10c and 6a'. Thus, when a bending or twisting force accidently acts on the electronic calculator, a distal end corner 6d' of the hard printed circuit board 6' may not contact the connecting pattern 10c to allow a local disconnecting force to act.

In the key input section and the printed circuit board connecting patterns having this configuration, when the key top 4 is depressed with a finger or the like, the projection 5a' of the key rubber sheet 5' is depressed and the skirt 5c' receives a gradually increasing compressive recovery force and is depressed downward with a click feeling described above. The lower surface 5b' of the projection 5a' presses the upper surface of the flexible printed circuit board 10 downward. The key input contact patterns 10b and 11b contact each other, to a key input signal is supplied to the LSI 7 through the connecting patterns 10c and 6a'.

Figure 4:
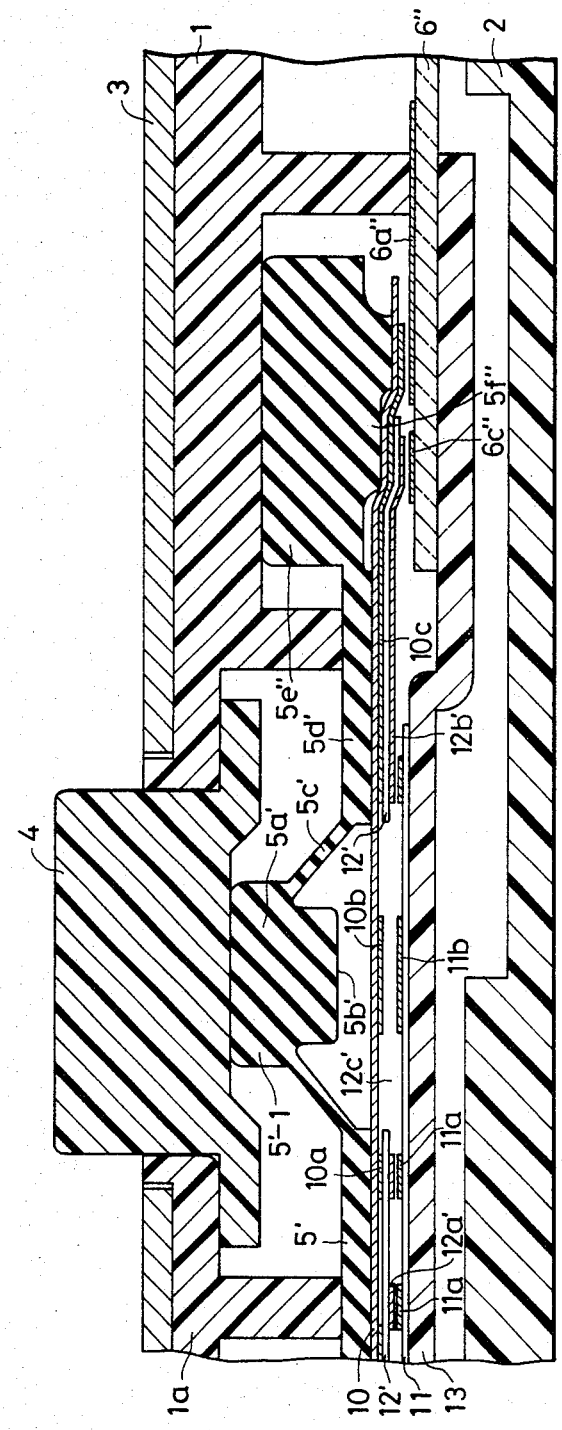
FIG. 4 is an enlarged view of an electronic calculator according to another embodiment of the present invention.

FIG. 4 shows another embodiment of the present invention, wherein a flexible printed circuit board 12' with a circuit pattern 12a' formed on one surface thereof is used as the spacer.

The circuit pattern 12a' is urged against and connected to a circuit pattern 11a of a flexible printed circuit board 11 by legs 1a of an upper case 1. A connecting pattern 12b' extending from the circuit pattern 12a' of the flexible printed circuit board 12' is urged against a connecting pattern 6c" of a hard printed circuit board 6" by a press portion 5e". The connecting portion 10c of the flexible printed circuit board 10 is also urged against and connected to a connecting pattern 6a' of the hard printed circuit board 6" by the press portion 5e". Since the flexible printed circuit boards 10 and 11 can be separately connected to the hard printed circuit board 6", complex circuit patterns 10a and 11a may be used, so that a greater number of key switches may be arranged within a predetermined area. A press surface 5f" of the press portion 5e" has a step corresponding to the thickness of a flexible printed circuit board 12'.

The flexible printed circuit boards 10 and 11 do not require soldering of electronic components or the like and may be easily manufactured by carbon printing a predetermined pattern on a polyester film base on one surface of which an aluminum foil is adhered, and etching the portion of the base exposed through the aluminum foil, thus using the aluminum foil as an etching resist. A printed circuit board which is manufactured by this method is simple and inexpensive to manufacture in comparison with a printed circuit board which has heat resistance to withstand soldering, thus providing inexpensive electronic equipment.

Since the connection between the flexible printed circuit board 10 and the hard printed circuit board 6' is performed utilizing part of the key rubber sheet 5', the number of parts involved is decreased and stable connection is obtained. Since an electrically conductive rubber need not be fixed to the key rubber sheet 5', the number of manufacturing steps is decreased to lower the manufacturing cost.

In the above embodiments, the reinforcing plate 13 is arranged below the lower surface of the flexible printed circuit board 11. However, if the printed circuit board 11 is hard enough and does not flex much, the reinforcing plate 13 may be omitted. Furthermore, if the projections 5a' of the key rubber sheet 5' are operated with finger or the like in place of the key tops 4, the key tops 4 may be omitted.

Various changes and modification may be made within the spirit and scope of the present invention.

What I claim is:

1. Electronic equipment having a key input function comprising:
    a first printed circuit board which has electronic components mounted thereon and which has first pattern for connection at an end thereof;
    a second printed circuit board which has a first contact for key input on a surface thereof;
    electrically connecting means which is flexible and which has a second contact for contacting said first contact of said second printed circuit board, and also has a second pattern for connection with said first pattern of said first printed circuit board;
    spacing means, interposed between said second printed circuit board and said electrically connecting means, for separating said second printed circuit board and said electrically connecting means from each other,
    operating means, of an elastic material and disposed to contact one surface of said electrically connecting means on the other surface of which said second contact is formed, said operating means having a recess for key inputting at a position corresponding to said second contact, and having an urging portion at a position corresponding to said second pattern; and
    clamping means for clamping said first printed circuit board and said urging portion so that the first pattern of said first printed circuit board and the second pattern of said connecting means can contact each other by a compressive recovery force of urging portion of said operating means.

2. Electronic equipment according to claim 1, wherein said first printed circuit board comprises a hard printed circuit board.

3. Electronic equipment according to claim 1, wherein said clamping means includes a reinforcing plate for supporting said second printed circuit board at a position corresponding to the first pattern of said first printed circuit board, and a case covering an upper surface of said operating means.

4. Electronic equipment according to claim 3, wherein a surface of said operating means which contacts said electrically connecting means is located at a level higher than a surface of said urging portion which urges said electrically connecting means.

5. Electronic equipment according to claim 1, wherein said spacing means has a printed pattern on a surface thereof, said first printed circuit board has a third pattern, and said printed pattern is urged against said third pattern for connection by said urging portion.

6. Electronic equipment according to claim 5, wherein said second printed circuit board has another printed pattern which contacts said printed pattern of said spacing means.

7. Electronic equiment according to claim 1, wherein said urging means has a shape such that a force thereof may concentrate on a surface thereof which contacts said electrically connecting means.

8. Electronic equipment according to claim 2, further comprising operating means, of an elastic material and adapted to contact one surface of said electrically connecting means on the other surface of which said second contact is formed, for urging said electrically connecting means, said spacing means, and said second printed circuit board against each other so as to connect or disconnect said first and second contacts, said operating means having a recess at a position corresponding to said second contact, and being formed integrally with urging means.

9. Electronic equipment having a key input function, comprising:
    key input means including a flexible printed circuit board having a first pattern for connection and a contact for key input;
    another printed circuit board which has electronic components mounted thereon and a second pattern for connection;
    elastic member disposed at a position corresponding to said first pattern, said elastic member having a shape of drawn contact surface so that an area of contact surface between said flexible printed circuit board and said elastic member may be smaller than that of contact surface between the contact surface and non-contact surface opposite to the contact surface; and
    housing means upon contact with the non-contact surface of said elastic member for urging said elastic member against said flexible printed circuit board and for contacting said first pattern with said second pattern.

10. Electronic equipment having a key input function, comprising:
    a first printed circuit board which has electronic components mounted thereon and a first pattern for connection;
    a second printed circuit board having a first contact for key input;
    spacing means which is placed on a surface of said second printed circuit board at which said first contact is arranged, and which has a notch at a position corresponding to said first contact said spacing means extending to cover an end portion of said first printed circuit board;
    supporting means for supporting said first and second printed circuit boards, so that a surface of said spacing means which does not contact said second printed circuit board may be located at a level higher than a surface of said first printed circuit board at which said first pattern is arranged;
    connecting means which is placed on an upper surface of said spacing means, and which has a second contact for key input at a position to oppose said first contact, and a second pattern for contacting said first pattern of said first printed circuit board; and
    means for bringing said first pattern of said first printed circuit board into contact with said second pattern of said connecting means.

* * * * *